United States Patent
Jones

(10) Patent No.: US 7,787,452 B2
(45) Date of Patent: Aug. 31, 2010

(54) ISOLATION OF UNVERIFIED DEVICES IN A SAS EXPANDER

(75) Inventor: Marc Timothy Jones, Costa Mesa, CA (US)

(73) Assignee: Emulex Design & Manufacturing Corporation, Costa Mesa, CA (US)

( * ) Notice: Subject to any disclaimer, the term of this patent is extended or adjusted under 35 U.S.C. 154(b) by 408 days.

(21) Appl. No.: 11/824,368

(22) Filed: Jun. 29, 2007

(65) Prior Publication Data

US 2009/0003197 A1    Jan. 1, 2009

(51) Int. Cl.
*H04L 12/28* (2006.01)
*H04L 12/56* (2006.01)

(52) U.S. Cl. ..................................... 370/389

(58) Field of Classification Search ............... 370/389, 370/221, 341, 241, 235, 236; 710/104, 36, 710/10, 9; 711/203, 217; 719/327, 326; 714/718

See application file for complete search history.

(56) References Cited

U.S. PATENT DOCUMENTS

| 7,478,177 | B2 * | 1/2009 | Cherian et al. ............... 710/9 |
| 2005/0108602 | A1 * | 5/2005 | Romero et al. ............ 714/718 |
| 2006/0101171 | A1 * | 5/2006 | Grieff et al. ................ 710/36 |
| 2006/0146698 | A1 | 7/2006 | Ukrainetz |
| 2008/0028107 | A1 * | 1/2008 | Cherian et al. ............... 710/9 |
| 2009/0007154 | A1 * | 1/2009 | Jones ......................... 719/326 |
| 2009/0007155 | A1 * | 1/2009 | Jones et al. ................ 719/327 |

* cited by examiner

*Primary Examiner*—Pankaj Kumar
*Assistant Examiner*—Prenell P Jones
(74) *Attorney, Agent, or Firm*—Morrison & Foerster LLP

(57) ABSTRACT

When a new device is attached to a SAS expander, malfunctioning devices can cause many BCNs to be generated, which in turn can cause excessive re-discovery processes to be performed by initiators in a storage network. Therefore, the isolation of devices from the storage network until they can be validated as healthy is disclosed. Any device malfunctions during this time of isolation do not cause BCNs to be generated and do not cause re-discovery processes to be performed. Once the device is validated (via a port-test-before-insertion approach) and found to be healthy, the fabric is notified via a BCN, and the device can be made visible to the network.

36 Claims, 5 Drawing Sheets

ISOLATION OF UNVERIFIED DEVICES IN A SAS EXPANDER

FIELD OF THE INVENTION

This invention relates to Serial Attached Small Computer System Interface (SAS) expanders, and more particularly to the isolation of devices connected to SAS expanders until verified, the binding of Serial Advanced Technology Attachment (SATA) Tunneling Protocol (STP) SAS addresses to Serial Advanced Technology Attachment (SATA) devices connected to SAS expanders, and the optimizing of re-discovery when a change has occurred in the network.

BACKGROUND OF THE INVENTION

A SAS expander can be generally described as a switch that allows initiators and targets to communicate with each other, and allows additional initiators and targets to be added to the system. In SAS-1.1, the total number of initiators and targets was limited to on the order of hundreds of devices. However, with SAS-2, SAS expanders can be connected to each other up to 16 levels deep, and therefore thousands of initiators and targets may be connected.

FIG. 1 illustrates two SAS expanders 102 and 114 connected together in exemplary storage network 100. Each SAS expander 102 and 114 can include a plurality of Phy 104, expander connection manager (ECM) 106 for allowing pathways to be built between two Phy, expander connection router (ECR) 108 which makes decisions regarding routing connections between Phy, and broadcast primitive processor (BPP) 110 for propagating broadcast change notifications (BCNs) to all other ports in the SAS expander except the port that caused the BCN to be generated.

FIG. 1 also shows an initiator 112 connected to a Phy 104 on first SAS expander 102, a SAS disk drive or other device 116 connected directly to another Phy on the first SAS expander as a direct attached drive, and second SAS expander 114 connected to the first SAS expander. Newly inserted device 116 is normally identified through the IDENTIFY process, and a broadcast change notification (BCN) is then generated by BPP 110 in SAS expander 102 to notify other devices in storage network 100 of the change. External initiators can then use the SAS Management Protocol (SMP) Discover command to identify device attachments. In addition, if device 116 was not properly seated in its connector, had a bad cable, or was otherwise misbehaving in ways that produced errors, BPP 110 would normally send out BCNs to other ports in SAS expander 102, which would cause all initiators (e.g. initiator 112) to perform a re-discovery process for every device in the network to understand the contents of the SAS fabric. If device 112 was generating intermittent errors, many BCNs (a "BCN storm") could be transmitted, creating many re-discovery processes to be performed. Alternatively, if a downstream SAS expander had an illegal configuration such as two Phy (on the same expander) connected together, this could also cause a BCN storm. Constant BCNs will impact the usability of a SAS network.

Therefore, there is a need to be able to isolate, test and validate devices before they are made visible to the network.

Two device types, SAS and Serial Advanced Technology Attachment (SATA), can commonly be connected to a storage network using SAS expanders. SAS devices have a unique 64-bit SAS address already assigned to them. However, current SATA devices do not have a SAS address. This is important, because to enable a SAS expander-attached SATA device to be visible to other devices in the network, the Phy to which it is attached must be assigned a unique SAS address. (Note that every Phy in a SAS domain must have a unique SAS address (with the exception of wide-ports, which all connect to the same device and can therefore share a common SAS Address)). Because SATA devices do not present a SAS address, they are assigned an address by the SAS expander. Each expander port maintains an SATA Tunneling Protocol (STP) SAS address, which identifies a SATA device connected to the port. However, if the SATA device is removed and replaced by a new SATA device, the old STP SAS address remains bound to the port, and thus any outstanding input/output (I/O) requests targeted to the removed SATA device will instead be delivered to the new SATA device connected to the same port, potentially corrupting the new SATA device.

FIG. 1 illustrates exemplary SAS expander 114 connected to SAS and SATA devices 118 and 120, respectively, in storage network 100, and the addressing problem created by attached SATA devices. SAS device 118 connected to Phy 122 within SAS expander 114 has its own SAS address Z, and thus if the SAS device is moved at 132 to another Phy (see Phy 134), the SAS address follows the SAS device. In contrast, SATA device 120 is connected to STP port 124 and Phy 126. STP port 124 provides translation functionality between SATA and SAS. SATA device 120 is assigned an address X which is bound to Phy 126, so that if the SATA device is moved to another port at 136 and a new SATA device is inserted in its place, the address X stays with the Phy, and the new SATA device receives the old STP address X. When this happens, outstanding I/O requests may complete to the new SATA device plugged into Phy 126 with address X, and the data will be written to or read from the wrong device, resulting in corruption.

One initiator-based solution to this problem is as follows. When a SATA device is removed, a BCN is generated. Because the source of the BCN cannot be distinctly identified down to an expander and port, all SATA drives in the SAS domain are placed in a hold state. All existing SATA I/O requests are aborted and new SATA I/O requests are rejected until the driver re-validates the SATA devices and removes them from the hold state.

A disadvantage of this solution is that any change in the domain (indicated by a BCN) causes all SATA devices to be placed into the hold state (as there is no way to know what changed). Additionally, any BCN (such as a SAS hot-insert) causes all SATA devices to be placed into the hold state. While this provides the maximum protection, it also places an additional burden on initiators for managing domain changes (above and beyond normal discovery).

Therefore, there is also a need to provide some level of persistent binding for a SATA device. If a SATA device is moved from one port to another, the STP SAS address should follow it to the new port.

As mentioned above, in earlier versions of SAS (e.g. SAS-1.1), only several hundred devices could practically be attached in the network. However, with SAS-2, due to changes such as higher link rates (3G to 6G) and innovations such as connection multiplexing which allows a single link to be time-division multiplexed to improve access, more than a thousand devices can be attached. This large number of devices can cause problems, as will be discussed below.

FIG. 1 illustrates initiator 112 and several SAS expanders 102 and 114 chained together. Each SAS expander 102 and 114 is self-configuring—that is, each expander takes care of its own route-table programming. Each expander has a plurality of ports to which devices or other expanders may be attached.

SMP allows initiators to perform discovery, in which each initiator communicates with every device to discover what is attached within the network. Each SAS expander may have to send an SMP REPORT_GENERAL command to each initiator, indicating how many devices are attached and providing other basic SAS expander information back to the initiator. Additionally, one SMP DISCOVER command would have to be sent out for each Phy on each SAS expander, and SAS expanders typically have 36-38 Phys. Initiators must therefore keep track of the device tree (which devices are connected to which expander, etc.).

Similarly, if a device is unplugged or otherwise changed, the discovery process requires that the SAS expander to which the device was attached send a BCN is sent out to all devices in the network. The BCN provides a notification of fabric changes without specific details. The initiator must then determine which devices are now unavailable (the expander, and all devices behind it). To accomplish this, each initiator must perform a full re-discovery of the entire SAS domain. Full rediscovery involves many SMP DISOVER commands to pinpoint one or two changes that have occurred in the fabric. For large SAS networks of 1000+ drives (requiring as many as 42 expanders), thousands of SMP commands can be performed to identify what changed in the network. In other words, there is no mechanism available to determine what changed in the SAS network without enumerating every Phy of every SAS expander. This process can be time-consuming, and in multi-initiator settings, can be performed by multiple initiators simultaneously. This has the effect of burdening the SAS network with management traffic and reducing the available I/O bandwidth. Thus, SAS does not scale well to large networks.

Therefore, there is also a need to enable an initiator to quickly and efficiently discover SAS network by obtaining re-discovery information about all devices in a network without having to perform a full re-discovery process.

SUMMARY OF THE INVENTION

Embodiments of the invention are directed to the use of existing SAS mechanisms to isolate new devices until they can be validated as healthy. When an internal PHY_ENABLE event is received from the Phy, the SAS expander will hold off on sending a BCN, and perform a conventional negotiation with the attached device to determine what kind of device is connected to the Phy (through the IDENTIFY sequence). The device can then be interrogated further to determine if it is inserted and working properly. Once the device is validated (via a port-test-before-insertion approach) and found to be healthy, the fabric is notified via a BCN, and a management entity can move the device from an isolated state into a visible state in the SAS domain. If the device was in a state that causes constant BCNs to be generated, the SAS expander can notify an external management device and then disable the device (either by powering the drive down, or by disabling its Phy). This protects the rest of the SAS network from misbehaving devices that could otherwise generate a BCN storm, and makes the network more manageable.

One advantage of this approach is that while the device is isolated, it can do no harm to the rest of the SAS network. The only entity that is able to communicate with the device in this condition is the SAS expander itself (the SMP initiator virtual phy and SSP/SATA initiator virtual phy within the SAS expander), which will perform verification techniques similar to the port-test-before-insertion (PTBI) techniques for Fibre Channel (FC) switches previously described in U.S. Patent Published Application No. 2006/0146698, the contents of which are incorporated by reference herein. The SAS expander may also disable the drive if it is known to present problems (e.g. a drive for which there are known incompatibilities).

Embodiments of the invention are also directed to providing persistent binding of STP SAS addresses to SATA devices so that they can be moved to different insertion points (ports) within a SAS expander and still properly receive I/O requests. When a SATA device is inserted into the SAS expander, it is placed into a provisional state while it is interrogated (using PTBI-like communications and a temporary address) to validate and obtain information about the attached device. This information may represent many different fields, such as manufacturer name, serial number, etc. Certain fields may be combined using a hashing function to obtain a unique ID for the SATA device.

After the unique ID has been generated for the SATA device, a search for the unique ID within a table can be performed, and if the unique ID is found in the table, the STP SAS address associated with the unique ID can be assigned to that Phy. In this manner, the same STP SAS address will be assigned to the Phy connected to a particular SATA device, regardless of where the device is connected to the SAS expander. If the unique ID is not found in the table, a new 64-bit STP SAS address can be assigned to that unique ID, and a new table entry can be created.

Embodiments of the invention are also directed to simplifying the re-discovery process for initiators by accepting a unicast-based notification which communicates the specifics of the change. In particular, an SMP command is sent from a SAS expander to an initiator, indicating the specific change in the network. Initiator BCN management is therefore avoided. Because the SAS expander knows exactly what changed, the expander simply notifies each initiator of the specific change, eliminating the need for each initiator to search the network for the change. This reduces the thousand or more SMP transactions per initiator to one SMP transaction per initiator (per change). In other words, the SMP DISCOVER data is pushed directly to initiators from the affected expander, requiring no re-discovery to be performed (and minimizing the SMP thrashing that can occur).

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the preferred embodiments of the present invention.

Figure 1:
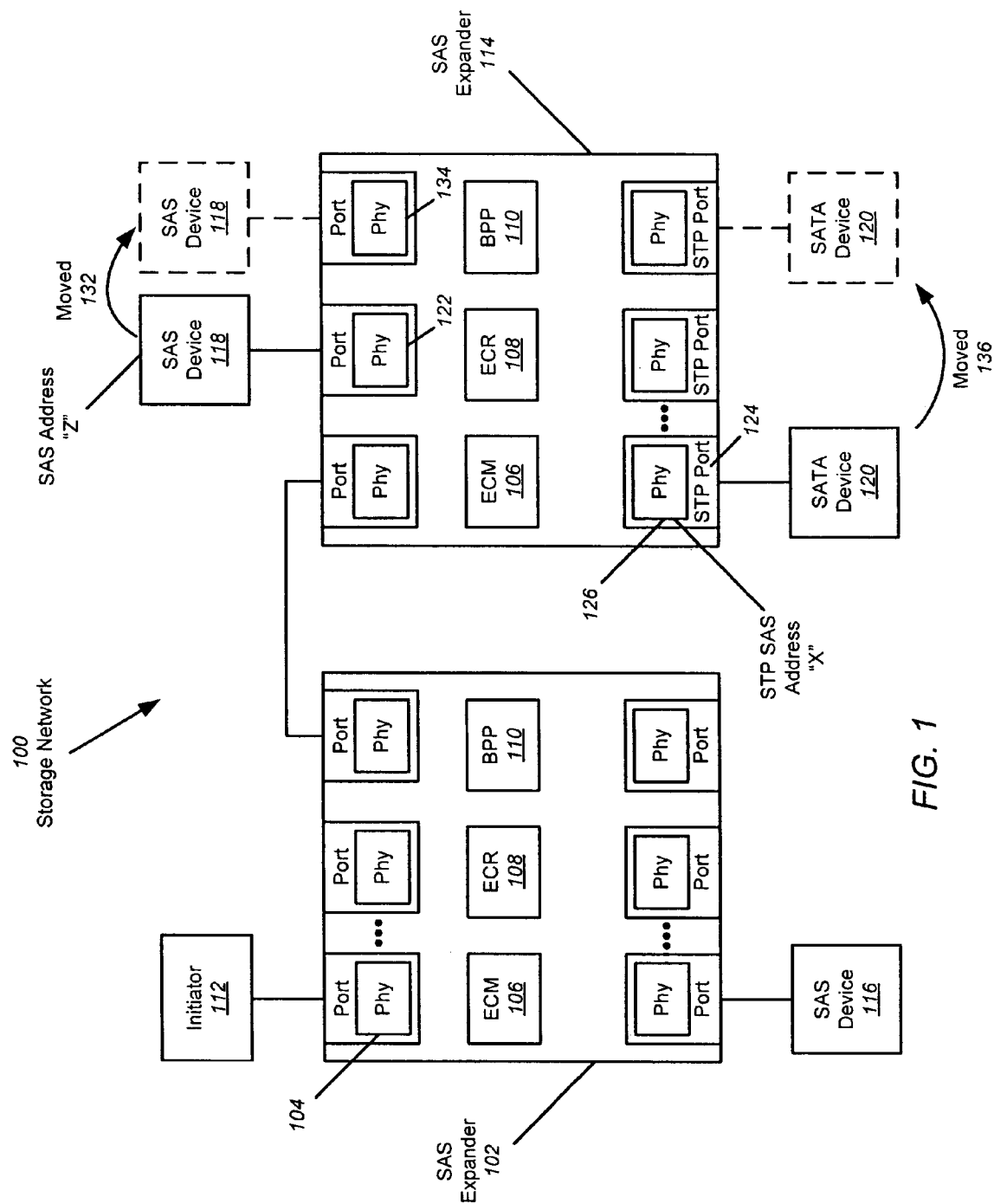
FIG. 1 illustrates two SAS expanders connected together in an exemplary storage network.
Figure 2:
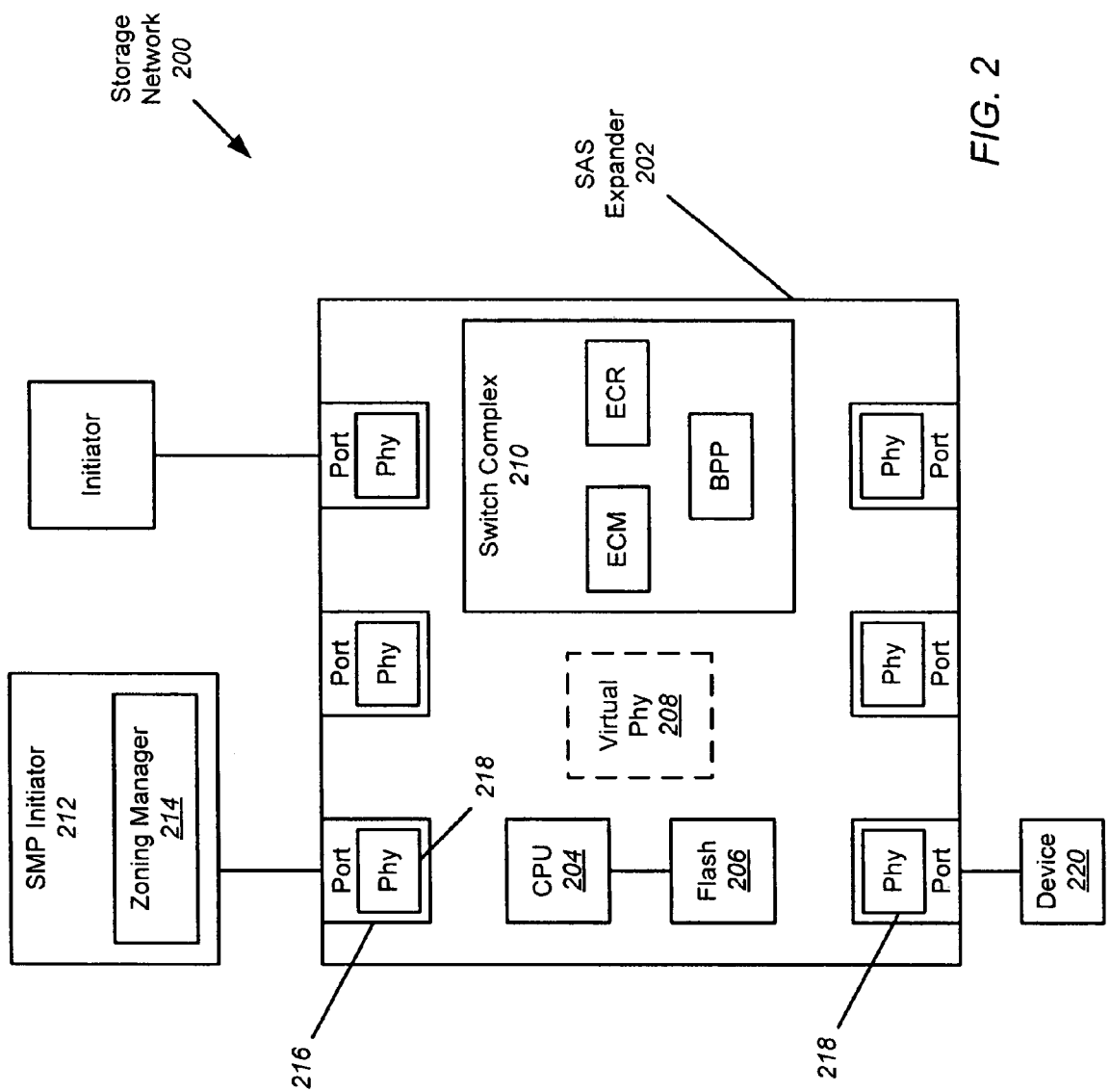
FIG. 2 illustrates an exemplary initiator connected to a storage network and employing the use of masking (making a Phy's attachment invisible to an initiator) to isolate devices prior to their verification and insertion into a network according to embodiments of the invention.

FIG. 2 illustrates exemplary SAS expander 202 connected within storage network 200 and employing the isolation of devices prior to their verification and insertion into a network according to embodiments of the invention. In FIG. 2, SAS expander 202 is shown with processor 204, flash 206, virtual Phy 208, and switch complex 210 including an ECM, ECR and BPP. Optionally connected to SAS expander 202 is SMP initiator 212, which contains zoning manager 214 that is responsible for performing zoning functions. Multiple ports 216 are present on SAS expander 202, each port containing a separate Phy 218. A device 220 may be connected to each Phy 218.

In a conventional SAS expander, if it is determined that a device is connected to a Phy, a negotiation or validation process is commenced between the SAS expander and the device to determine information about the device and verify that the device was connected and working properly. In either case (in both the nominal and exception (error) case), once the Phy changes status as a result of the connected device, the SAS expander sends out a BCN to all other devices in the network, which causes all initiators to perform a rediscovery process to rediscover all devices in the network. One exception to transmission of a BCN is when a new device is inserted but does not pass the PTBI process. In this case, no BCN is sent because no change occurred in the SAS domain.

However, according to embodiments of the invention, when an PHY_ENABLE event is received through virtual Phy 208, indicating that a device has been connected to a regular Phy, SAS expander 202 will perform a conventional negotiation with the device (speed determination, IDENTIFY exchange, etc.) but will hold off on the generation of a BCN while the SAS expander validates the attached device. During this time, if an initiator performed discovery, the Phy would return a SMP PHY_VACANT response, indicating that there is no device attached to the Phy (when in fact there is). Thus, the device remains isolated and invisible to external initiators. With the IDENTIFY frames exchanged, the SAS expander knows which kind of device is behind the Phy and can interrogate it further (either through an SMP and Serial SCSI Protocol (SSP) dialogue, or through an SMP and SATA dialogue). Each Phy 218 for which a connected device has been detected will then perform a port test before insertion (PTBI)-like validation process using SMP and SCSI commands to ensure that the device is valid and that it is of a type supported by SAS expander 202. For example, Phy 218, which is isolated and is connected to device 220, will perform the validation process on the device.

If it is determined that device 220 is bad, the Phy can be disabled or the device itself can be powered down so that no commands can be sent to device 220, and a notification can be sent to a system administrator or an external management device. Note that no BCN is sent out, and thus the bad device does not cause all initiators to perform a re-discovery process. This protects the rest of the SAS network from misbehaving devices that could otherwise generate a BCN storm, and makes the network more manageable.

On the other hand, if device 220 is determined to be good, firmware in SAS expander 202 then exposes the Phy and its attached device to the larger SAS fabric (i.e. the Phy no longer emits an SMP PHY_VACANT response for SMP DISCOVER requests). Having been exposed to the SAS fabric, all other devices in the network, including zoning manager 214, will now be able to "see" and communicate with device 220.

Figure 3:
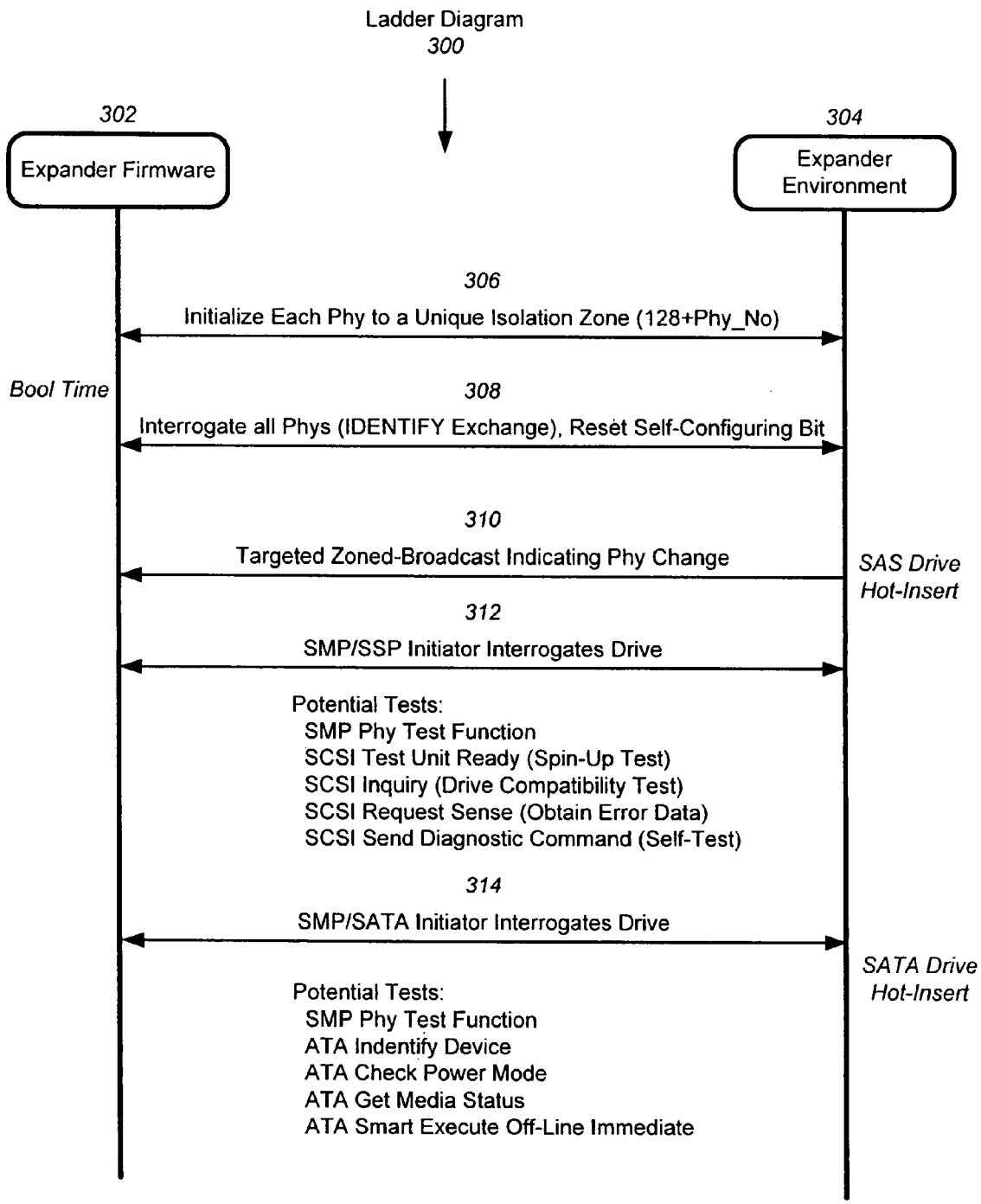
FIG. 3 is a ladder diagram illustrating the exemplary commmunications between the SAS expander firmware and other logic and functions within the SAS expander according to embodiments of the invention.

FIG. 3 is a ladder diagram 300 illustrating the exemplary communications between SAS expander firmware 302 and other logic and functions 304 within the SAS expander according to embodiments of the invention. In the first communication 306, each Phy is initialized and isolated. The Phy are also enabled so that they can negotiate with a Phy to which they are attached and exchange information about the Phy. Next, each Phy is interrogated at 308 using an IDENTIFY exchange to validate and obtain information about the device attached to the Phy, and the self-configuring bit is reset. These aforementioned steps are performed at startup or boot time of the SAS expander, or whenever a new device is attached to the SAS expander.

At some later time, if a SAS device is hot-inserted to the SAS expander, a PHY_ENABLE is sent to SAS expander firmware 302, indicating a Phy change. In response to the Phy change, if the inserted device is a SAS device (as determined by the IDENTIFY exchange), an SMP/SSP Initiator within the SAS expander interrogates the attached devices at 312 to gather information about the attached SAS device. No BCN is sent out at this time. During this time, if an initiator performed discovery, the Phy would return a SMP PHY_VACANT response, indicating that there is no device attached to the Phy (when in fact there is). Thus, the device remains isolated and invisible to external initiators. The SMP/SSP initiator determines the health of the device, and then either leaves the Phy isolated if the device is bad, or reveals the Phy to the larger SAS fabric (i.e. the Phy no longer emits an SMP PHY_VACANT response for SMP DISCOVER requests). Potential tests for a SAS drive include, but are not limited to, SMP Phy Test Function, SCSI Test Unit Ready (spin-up test), SCSI Inquiry (drive compatibility test), SCSI Request Sense (obtain error data), and SCSI Send Diagnostic Command (self-test). The SMP/SSP initiator then sends a zoned-broadcast message to zoning manager 214 so that the zoning manager can further configure the Phy to the appropriate zone group.

If the inserted device is a SATA device (as determined by the Signature frame (similar to the IDENTIFY exchange)), an SMP/SATA initiator within the SAS expander interrogates the drive at 314 to gather information about the device. The SMP/SATA initiator at the virtual phy determines the health of the device, and then either leaves the device as isolated if the device is bad, or makes the device visible in the SAS domain and emits a BCN. Potential tests for a SATA drive include, but are not limited to, SMP Phy Test Function, ATA Identify Device, ATA Check Power Mode, ATA Get Media Status, and ATA Smart Execute Off-Line Immediate. The SMP/SATA initiator then sends a zoned-broadcast message to zoning manager 214 so that the zoning manager can further configure the phy to the appropriate zone group.

In an alternative embodiment, if supported, isolation can be accomplished using zone groups. Some versions of SAS employ the concept of assigning zone groups to devices such that only those devices with compatible zone groups can communicate with each other. In SAS, eight bits are used to define zone groups. Zone groups 0-127 are valid zone groups, while zone groups 128-255 are reserved zone groups.

According to this alternative embodiment, the SAS expander, under the control of firmware executed by a processor within the SAS expander, assigns a unique reserved zone group number to each Phy in the SAS expander. By assigning a unique reserved zone group number to each Phy, no Phy (except the virtual Phy within the SAS expander) can see any other Phy. When a Phy_enable event is received through the virtual Phy, indicating that a device has been connected to a regular Phy, the SAS expander will perform a conventional negotiation with the device (speed determination, IDENTIFY exchange, etc.). With the IDENTIFY frames exchanged, the SAS expander knows which kind of device is behind the Phy and can interrogate it further (either through an SMP and SSP dialogue, or through an SMP and SATA dialogue). Each Phy for which a connected device has been detected will then perform a PTBI-like validation process using SMP and SCSI commands to ensure that the device is valid and that it is of a type supported by the SAS expander.

If a Phy determines that its attached device is bad, the Phy can be disabled or the device itself can be powered down so that no commands can be sent to the device, and a notification can be sent to a system administrator or an external management device. Note that no BCN is sent out, and thus the bad device does not cause all initiators to perform a re-discovery process. This protects the rest of the SAS network from misbehaving devices that could otherwise generate a BCN storm, and makes the network more manageable.

On the other hand, if the attached device is determined to be good, firmware in the SAS expander then changes the Phy to have a unique valid zone group number selected from a subset of the valid zone group numbers 0-127. For example, the subset of valid zone group numbers can be 0-3. In addition, the SAS expander notifies the rest of the fabric by transmitting a BCN. Having been assigned a unique valid zone group number selected from the subset of valid zone group numbers, all other devices connected to Phy with valid zone types in the network, including the zoning manager, will now be able to "see" and communicate with the device. When the zoning manager sees that the Phy now has a valid zone group number, it can then re-assign that Phy to have a unique valid zone group number outside the subset of valid zone group numbers.

In a further alternative embodiment, instead of using a zoning manager, flash memory within SAS expander may contain a mapping of device address, slot or Phy to zone group number. Thus, when a device is determined to be good, the firmware in the SAS expander can change the Phy to have a valid zone based on the address, slot or Phy of the device (which was determined during the validation process) and the mapping stored in the flash memory.

Figure 4:
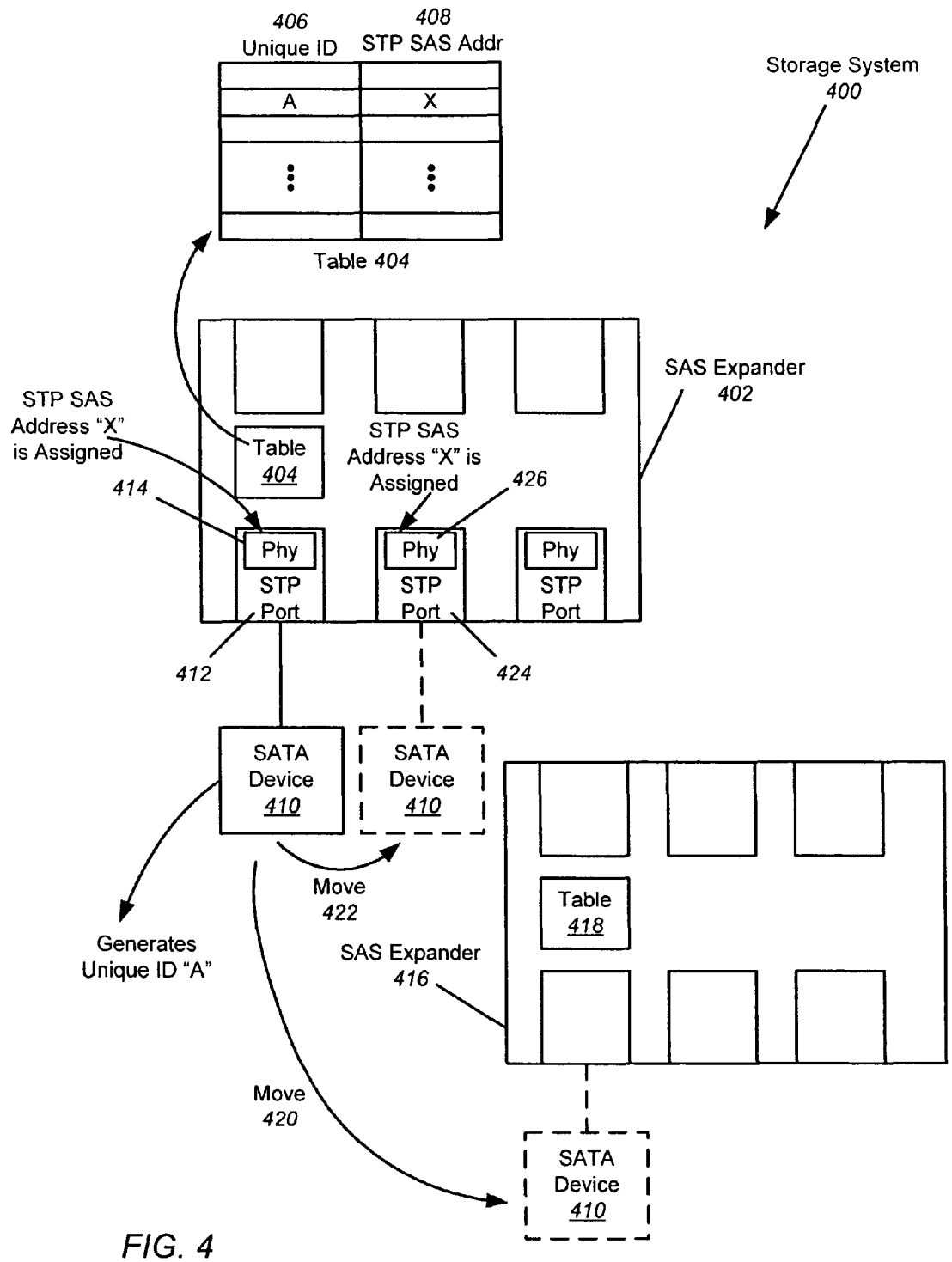
FIG. 4 illustrates an exemplary SAS expander utilizing a table for mapping device information to a SAS address according to embodiments of the invention.

FIG. 4 illustrates an exemplary SAS expander 402 in a storage system 400 utilizing a table 404 for mapping a device ID 406 to an STP SAS address 408 according to embodiments of the invention. In the example of FIG. 4, if SATA device 410 is connected to SAS expander 402 at an STP port 412, instead of binding the STP SAS address X to Phy 414 within STP port 412, table 404 is utilized. Table 404 contains a mapping of a unique ID 406 to a 64-bit STP SAS address 408. The STP SAS addresses 408 are not bound to any particular port.

When a SATA device is inserted into the SAS expander, it is placed into a provisional (isolated) state while it is interrogated (using PTBI-like communications and a temporary address). As mentioned above, during the validation process, each Phy (and its attached device) are interrogated using an IDENTIFY exchange to validate and obtain information about the Phy and the attached device. This information may represent many different fields, such as manufacturer name, serial number, etc. One of these fields could be the World Wide Name (WWN) field (e.g., 4-16 bytes). The WWN is assigned by the IEEE and must be used by the manufacturer of the SATA device. Certain fields may be combined using a hashing function to obtain a unique ID for the device.

Thus, in the example of FIG. 4, after a unique ID has been generated for SATA device 410, under the control of a processor and/or logic within SAS expander 402, a search for the unique ID within table 404 can be performed, and if the unique ID is found in the table, the 64-bit STP SAS address associated with the unique ID can be assigned to that Phy. If the unique ID is not found in the table, a new 64-bit STP SAS address can be assigned to that unique ID, and a new table entry can be created. In an alternative embodiment, the new 64-bit STP SAS address may be selected from previously used addresses using a recursive or Least Recently Used (LRU) algorithm. In other words, the available STP SAS addresses (for STP port assignment) are sorted in last used order to put temporal distance between STP SAS address usages. After an STP SAS address is bound to the port, the port is migrated from the provisional state to the operational state and a BCN generated to indicate domain change.

The same STP SAS address will thereafter be assigned to the Phy connected to SATA device 410, regardless of where the SATA device is connected to the SAS expander. Thus, even if SATA device 410 is moved at 422 to STP port 424, the same process described above is performed, unique ID A is once again generated at STP port 424, and the table 404 is once again used to assign STP SAS address "X" to Phy 426.

It should be noted, however, that if SATA device 410 is removed and connected to a different SAS expander 416 (see relocation 420), that new SAS expander will only have access to its own table 418, and thus a new STP SAS address would be assigned to that SATA device the first time it is connected to the new SAS expander, using table 418. Any outstanding I/O requests for the old STP SAS address would not complete, and would be rejected.

Embodiments of the invention described above therefore provide a SAS expander-based solution to the problem of assigning STP SAS addresses to SATA drives that affords maximum protection to SATA devices in a very non-disruptive way. The SAS expander-based solution both solves the problem locally, and scales well into larger SAS fabrics.

Another embodiment of the invention enables a SAS expander to provide an indication to an initiator of what changes occurred in the network, rather than require each initiator to rediscover all devices. In particular, when a change is detected in the network, an SMP command is sent from the SAS expander to the initiator, indicating the specific change in the network. Because the SAS expander knows exactly what changed, rather than relying on each initiator to perform BCN management to search the network for the change, the SAS expander simply notifies each initiator of the specific change. This reduces the thousand or more SMP transactions (in a large SAS fabric) per initiator to one SMP transaction per initiator (per change).

Figure 5:
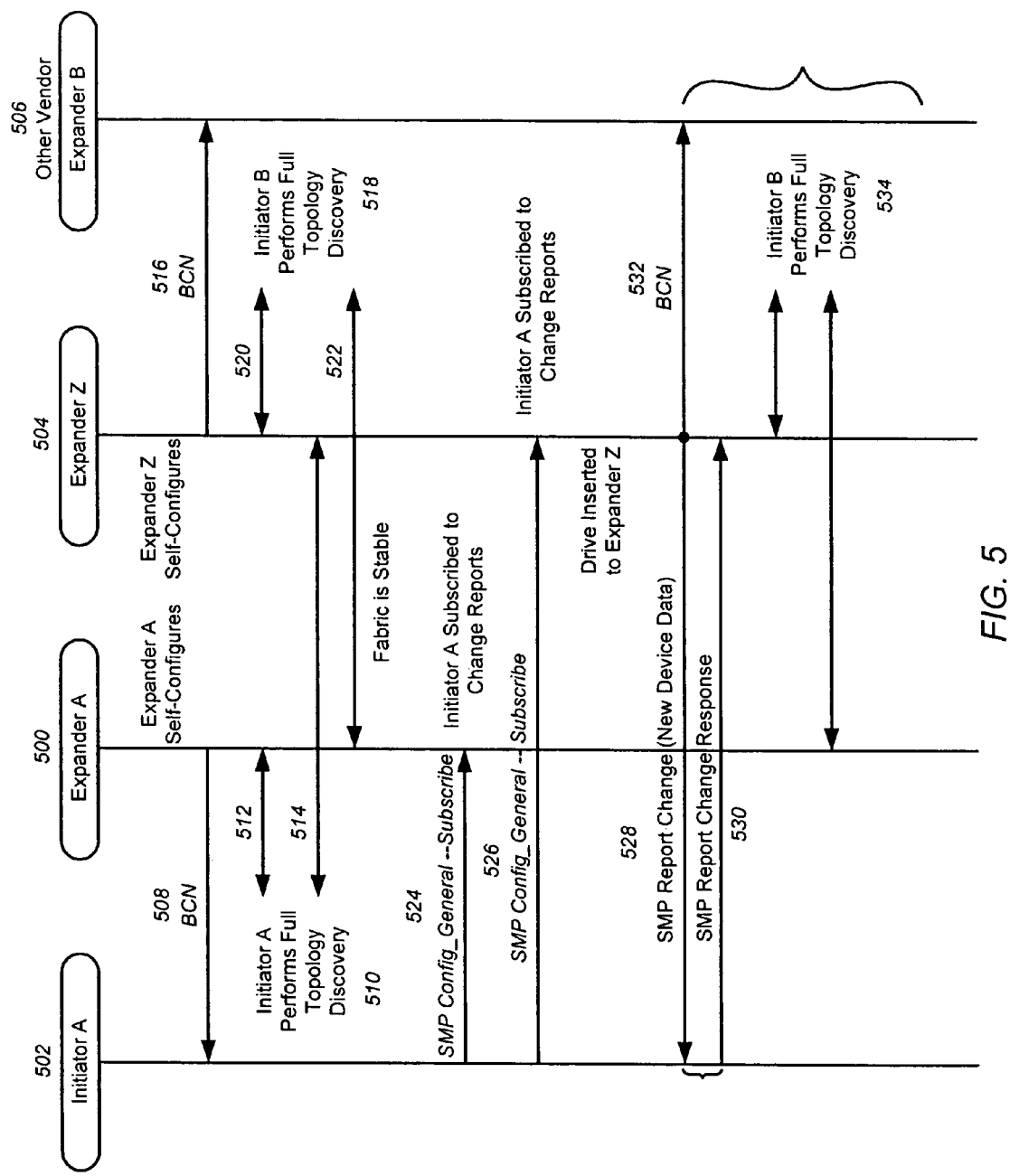
FIG. 5 is an exemplary ladder diagram illustrating communications between SAS expanders and initiators to provide an initiator with information about a change in the network according to embodiments of the invention.

FIG. 5 is an exemplary ladder diagram illustrating communications between SAS expanders 500 and 504 and initiators 502 and 506, where SAS expanders 500 and 504 and initiator 502 are enhanced according to embodiments of the invention, and initiator 506 is conventional in design. Both initiators 502 and 506 are connected to a single SAS domain. The firmware in the initiators must be able to receive and respond to the new SMP commands discussed below.

In the initial discovery phase, both initiators behave in the same way (full enumeration of the domain). Expander 500 sends a BCN 508 to initiator 502 (and all other endpoints), and the initiator performs a full topology discovery at 510, discovering both expander A and B (see 512 and 514). Similarly, expander 504 sends a BCN 516 to initiator 506, and the initiator performs a full topology discovery at 518, discovering both expander A and B (see 522 and 520). During this discovery process, each SAS expander 500 and 504 sends an SMP REPORT_MANU_INFO command to initiators 502 and 506, respectively, to provide attached device manufacturer information to the initiators. The SAS expanders 500 and 504 also send another command to initiators 502 and 506, respectively, to indicate the SAS expanders' capabilities. Once an initiator completes the initial discovery process, it has a baseline of the entire SAS fabric (all devices that exist at that epoch in time). At this point, the fabric is stable.

Initiator 502, under the control of firmware executed by a processor within the initiator according to embodiments of the invention, and being aware of the enhanced capabilities of SAS expanders 500 and 504 according to embodiments of the invention, then contacts each enhanced SAS expander (SMP Target) and subscribes to change reports by sending out an SMP CONFIG_GENERAL command (an extension of the conventional SMP CONFIG_GENERAL command) at 524 and 526 to each SAS expander. Note that when initiator 502 performs an SMP REPORT_MANU_INFO command, it knows that the expander is a SAS expander according to embodiments of the invention. With this, the initiator performs an SMP REPORT_CAPABILITIES command to know what capabilities the SAS expander has.

Because initiator 502 subscribed to change reports, when a new device is inserted into SAS expander 504, BCNs transmitted by the SAS expander will be ignored by the initiator. Instead, an SMP REPORT_CHANGE command 528, which is an SMP transaction and a variation on a conventional SMP DISCOVER command and an SMP REPORT_PHY_SATA command, is unicast directly from SAS expander 504 to subscribing initiator 502. The SMP REPORT_CHANGE command (vendor extension) 528 notifies initiator 502 that a new device has been inserted into SAS expander 504, and provides information about that new device. In particular, the SMP REPORT_CHANGE command 528 provides SMP DISCOVER command data (essentially the same data that is returned in a response to an SMP DISCOVER command, indicating, for a given Phy on the SAS expander, what device is attached), plus other vendor-unique information. The SMP REPORT_CHANGE command 528 requires that initiator 502 support an SMP Target. After initiator 502 receives the SMP REPORT_CHANGE command 528 and its associated data, the initiator returns an SMP REPORT_CHANGE_RESPONSE 530 to expander 504. Nothing is provided back to the SAS expander, other than the initiator confirms receipt of the command by setting the Function Result within the SMP response to SUCCESS. The result is an optimized rediscovery of the SAS fabric that allows a SAS expander to communicate in a single transaction what device change occurred. An SMP initiator in the SAS expander 504 performs this operation for each external initiator that has subscribed for change reports, freeing each subscribing initiator from having to rediscover the entire network.

However, if a conventional SAS expander notes a change in the network and sends out a BCN, an enhanced initiator according to embodiments of the present invention will temporarily ignore the BCN and wait for an SMP REPORT_CHANGE from that SAS expander. Receiving none after a predetermined period of time, the enhanced initiator will rediscover the entire network in the conventional manner. In an alternative embodiment, because the enhanced initiator knows that a BCN could only have been sent from a conventional SAS expander, the initiator will only rediscover the conventional SAS expanders. Also, when expanders are added or removed, a new fabric baseline must be performed (as shown in FIG. 5).

Referring again to the example of FIG. 5, because initiator 506 is conventional, it does not send out any SMP CONFIG_GENERAL command to any SAS expanders to subscribe to change reports. Because initiator 506 did not subscribe to change reports, when a new device is inserted into expander 504 and BCN 532 is transmitted to initiator 506 to provide a notification of a fabric change, initiator 506 performs a full re-discovery 534 (which is essentially the same as the initial discovery process) in the conventional manner to identify the change that occurred. Embodiments of the invention can therefore be considered SAS-friendly because the behavior of an initiator will be unaffected (it will perform SAS re-discovery in the conventional manner, for which SAS expander support remains) if the initiator is not aware of the enhanced capability of the SAS expander and fails to subscribe to change reports.

Embodiments of the invention also support existing SAS behaviors such as SATA device insertion. If the initiator must spin up a SATA device, an SMP REPORT_GENERAL command will indicate that the SATA device is in a spinup-hold state (via the negotiated physical link rate (NPLR) in the SMP DISCOVER data). The initiator must then issue an SMP PHY_CONTROL command to transition the SATA device out of the spinup-hold state. Commonly, a new BCN will result (indicating the drive has spun-up), but in the case of initiator 502, a new SMP REPORT_CHANGE command 528 will result, with an updated NPLR.

As described above, embodiments of the invention can advantageously provide a large reduction in SAS management traffic for an initiator, particularly in large SAS networks, a large reduction in SAS management traffic in the interior of the SAS network (particular in multi-initiator environments), a SAS protocol friendly method capable of operating alongside standard SAS-1.1 or SAS-2 devices, better performance of SAS networks in device change scenarios, and the ability for SAS to support very large networks of drives without the bandwidth reduction due to rediscovery.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A Serial Attached SCSI (SAS) expander for validating an attached device before enabling the attached device to be visible to a storage network, comprising:
a processor programmed for
isolating the device from the storage network,
performing a validation procedure on the device,
maintaining the device in an isolated state by holding off generating a broadcast change notification (BCN) if the device is determined to be invalid or not supported by the SAS expander, and
exposing the device to the storage network by sending out a BCN to the storage network if the device is determined to be valid and supported by the SAS expander.

2. The SAS expander of claim 1, the processor further programmed for performing the validation procedure on the device by performing a port-test-before-insert (PTBI) procedure.

3. The SAS expander of claim 1, the processor further programmed for disabling the device if it is determined to be invalid or not supported by the SAS expander.

4. The SAS expander of claim 1, the processor further programmed for optionally powering down the device if it is determined to be invalid or not supported by the SAS expander.

5. The SAS expander of claim 1, further comprising one or more initiators and one or more devices coupled to the SAS expander.

6. A storage network comprising the SAS expander of claim 1.

7. The SAS expander of claim 1, the processor further programmed for isolating the device by generating an SMP PHY_VACANT response if an initiator attempts to discover the device.

8. The SAS expander of claim 7, the processor further programmed for exposing the device to the storage network by no longer generating an SMP PHY_VACANT response if an initiator attempts to discover the device.

9. The SAS expander of claim 1, the processor further programmed for isolating the device by initially assigning a unique reserved zone group number to a Phy connected to the device.

10. The SAS expander of claim 9, the processor further programmed for exposing the device to the storage network by assigning a unique valid zone group number to the Phy connected to the device.

11. The SAS expander of claim 1, the processor further programmed for assigning a valid zone group number selected from a predetermined subset of all valid zone group numbers to the Phy connected to the device if it is determined to be valid and supported by the SAS expander.

12. The SAS expander of claim 11, further comprising a zoning manager communicatively coupled to the SAS expander for re-assigning the Phy connected to the device to a valid zone group number selected from those valid zone group numbers outside the predetermined subset of all valid zone group numbers if the device is determined to be valid and supported by the SAS expander.

13. The SAS expander of claim 1, the processor further programmed for assigning a valid zone group number to the Phy connected to the device using a mapping of a device identifier to zone group number if the device is determined to be valid and supported by the SAS expander.

14. A Serial Attached SCSI (SAS) expander for validating an attached device before enabling the attached device to be visible to a storage network, comprising:
 means for isolating the device from the storage network;
 means for performing a validation procedure on the device;
 means for maintaining the device in an isolated state by holding off generating a broadcast change notification (BCN) if the device is determined to be invalid or not supported by the SAS expander; and
 means for exposing the device to the storage network by sending out a BCN to the storage network if the device is determined to be valid and supported by the SAS expander.

15. A method for validating a device attached to a Serial Attached SCSI (SAS) expander before enabling the device to be visible to a storage network, comprising:
 isolating the device from the storage network,
 performing a validation procedure on the device,
 maintaining the device in an isolated state by holding off generating a broadcast change notification (BCN) if the device is determined to be invalid or not supported by the SAS expander, and
 exposing the device to the storage network by sending out a BCN to the storage network if the device is determined to be valid and supported by the SAS expander.

16. The method of claim 15, further comprising performing the validation procedure on the device by performing a port-test-before-insert (PTBI) procedure.

17. The method of claim 15, further comprising disabling the device if it is determined to be invalid or not supported by the SAS expander.

18. The method of claim 15, further comprising powering down the device if it is determined to be invalid or not supported by the SAS expander.

19. The method of claim 15, further comprising isolating the device by generating an SMP PHY_VACANT response if an initiator attempts to discover the device.

20. The method of claim 19, further comprising exposing the device to the storage network by no longer generating an SMP PHY_VACANT response if an initiator attempted to discover the device.

21. The method of claim 15, further comprising isolating the device by initially assigning a unique reserved zone group number to a Phy connected to the device.

22. The method of claim 21, further comprising exposing the device to the storage network by assigning a unique valid zone group number to the Phy connected to the device.

23. The method of claim 15, further comprising assigning a valid zone group number selected from a predetermined subset of all valid zone group numbers to the Phy connected to the device if the device is determined to be valid and supported by the SAS expander.

24. The method of claim 23, further comprising re-assigning the Phy connected to the device to a valid zone group number selected from those valid zone group numbers outside the predetermined subset of all valid zone group numbers if the device is determined to be valid and supported by the SAS expander.

25. The method of claim 15, further comprising assigning a valid zone group number to the Phy connected to the device using a mapping of a device identifier to zone group number if the device is determined to be valid and supported by the SAS expander.

26. A computer-readable non-transitory medium storing program code for isolating devices connected into a storage network until they can be validated, the program code for causing performance comprising:
 isolating the device from the storage network,
 performing a validation procedure on the device,
 maintaining the device in an isolated state by holding off generating a broadcast change notification (BCN) if the device is determined to be invalid or not supported by the SAS expander, and
 exposing the device to the storage network by sending out a BCN to the storage network if the device is determined to be valid and supported by a SAS expander.

27. The computer-readable non-transitory medium of claim 26, the program code further for causing performance of a method comprising performing the validation procedure on the device by performing a port-test-before-insert (PTBI) procedure.

28. The computer-readable non-transitory medium of claim 26, the program code further for causing performance of a method comprising disabling the device if it is determined to be invalid or not supported by the SAS expander.

29. The computer-readable non-transitory medium of claim 26, the program code further for causing performance of a method comprising powering down the device if it is determined to be invalid or not supported by the SAS expander.

30. The computer-readable non-transitory medium of claim 26, the program code further for causing performance of a method comprising isolating the device by generating an SMP PHY_VACANT response if an initiator attempts to discover the device.

31. The computer-readable non-transitory medium of claim 30, the program code further for causing performance of a method comprising exposing the device to the storage network by no longer generating an SMP PHY_VACANT response if an initiator attempted to discover the device.

32. The computer-readable non-transitory medium of claim 26, the program code further for causing performance of a method comprising isolating the device by initially assigning a unique reserved zone group number to a Phy connected to the device.

33. The computer-readable non-transitory medium of claim 32, the program code further for causing performance of a method comprising exposing the device to the storage network by assigning unique valid zone group numbers to the Phy connected to the device.

34. The computer-readable non-transitory medium of claim 26, the program code further for causing performance of a method comprising assigning a valid zone group number selected from a predetermined subset of all valid zone group numbers to the Phy connected to the device if the device is determined to be valid and supported by the SAS expander.

35. The computer-readable non-transitory medium of claim 34, the program code further for causing performance of a method comprising re-assigning the Phy connected to the device to a valid zone group number selected from those valid zone group numbers outside the predetermined subset of all valid zone group numbers if the device is determined to be valid and supported by the SAS expander.

36. The computer-readable non-transitory medium of claim 26, the program code further for causing performance of a method comprising assigning a valid zone group number to the Phy connected to the device using a mapping of a device identifier to zone group number if the device is determined to be valid and supported by the SAS expander.

* * * * *